United States Patent
Bae

(10) Patent No.: US 8,217,710 B2
(45) Date of Patent: Jul. 10, 2012

(54) FUSE FOR USE IN HIGH-INTEGRATED SEMICONDUCTOR DEVICE

(75) Inventor: Byung Wook Bae, Icheon (KR)

(73) Assignee: Hynix Semiconductor Inc, Icheon (KR)

( * ) Notice: Subject to any disclaimer, the term of this patent is extended or adjusted under 35 U.S.C. 154(b) by 227 days.

(21) Appl. No.: 12/650,305

(22) Filed: Dec. 30, 2009

(65) Prior Publication Data

US 2010/0225381 A1 Sep. 9, 2010

(30) Foreign Application Priority Data

Mar. 4, 2009 (KR) ........................ 10-2009-0018451

(51) Int. Cl.
*H01H 37/76* (2006.01)
(52) U.S. Cl. ........................ 327/525; 257/529
(58) Field of Classification Search ................. 327/526, 327/527, 525; 257/209, 529
See application file for complete search history.

(56) References Cited

U.S. PATENT DOCUMENTS

| | | | | |
|---|---|---|---|---|
| 5,570,318 A | * | 10/1996 | Ogawa | 365/200 |
| 5,844,296 A | * | 12/1998 | Murray et al. | 257/529 |
| 6,008,523 A | * | 12/1999 | Narayan et al. | 257/529 |
| 6,577,156 B2 | * | 6/2003 | Anand et al. | 326/37 |
| 6,861,739 B1 | * | 3/2005 | Bhavnagarwala et al. | 257/691 |
| 6,900,516 B1 | * | 5/2005 | Banisch et al. | 257/529 |
| 7,098,721 B2 | * | 8/2006 | Ouellette et al. | 327/525 |
| 7,361,967 B2 | * | 4/2008 | Takahashi et al. | 257/529 |
| 7,598,537 B2 | * | 10/2009 | Sasahara | 257/173 |
| 7,952,951 B2 | * | 5/2011 | Lee | 365/225.7 |
| 2006/0267137 A1 | * | 11/2006 | Gambino et al. | 257/529 |
| 2008/0259709 A1 | * | 10/2008 | Chi | 365/222 |
| 2009/0179301 A1 | * | 7/2009 | Song | 257/529 |

FOREIGN PATENT DOCUMENTS

| | | |
|---|---|---|
| JP | 2009-021282 A | 1/2009 |
| KR | 1020000017555 A | 3/2000 |
| KR | 1020080029696 A | 4/2008 |

* cited by examiner

*Primary Examiner* — Thomas J Hiltunen

(57) ABSTRACT

The invention relates to a semiconductor device comprising a fuse that is implemented as a bar type pattern that forms a straight line instead of a pattern that is difficult to secure a manufacturing margin. A fuse block including a plurality of fuses comprises a plurality of first connection parts, each including a blowing area, a plurality of second connection parts, wherein the plurality of the second connection parts and the plurality of the corresponding first connection parts respectively form part of the fuse, and a common connection unit configured to electrically connect the plurality of the first connection parts and the plurality of the second connection parts.

10 Claims, 6 Drawing Sheets

FUSE FOR USE IN HIGH-INTEGRATED SEMICONDUCTOR DEVICE

CROSS-REFERENCES TO RELATED APPLICATIONS

The present application claims priority to Korean patent application number 10-2009-0018451, filed on Mar. 4, 2009, which is incorporated by reference in its entirety.

BACKGROUND OF THE INVENTION

The present invention relates to a highly integrated semiconductor device, more particularly, to a fuse within a highly integrated semiconductor device that is capable of determining whether to transfer an electronic signal or connect two different terminals.

A fuse is generally used in many electrical and electronic devices. In a normal condition, the fuse allows current to flow in the circuit. However, when the fuse is cut in the overcurrent condition, the fuse permanently makes whole or partial of the circuit shut off. Unlike a is switch, the fuse cannot be used for temporarily turning on or off current flow in a circuit.

A semiconductor device is made to perform a specific operation by a fabrication process including injecting an impure material and depositing conductive and nonconductive materials onto a predetermined area of a wafer mounted in a chamber. One example of the semiconductor device is a semiconductor memory device. The semiconductor memory device includes plural components or elements such as a transistor, a capacitor, a resistor, a fuse, and etc. Herein, the capacitor is mainly used for temporarily storing data, and the fuse is used in a redundancy circuit or a power supply circuit of the semiconductor memory.

The redundancy circuit using the fuse for permanently storing address of a defective cell (or unit cell) replaces the defective unit cell with a spare cell in order to prevent the semiconductor memory device having a minor defect from being treated as a defective product, thereby increasing the yield. Recently, a memory chip density of the semiconductor memory device increases. When few unit cells in the semiconductor memory device are defective, destroying the semiconductor memory device including few defective cells can be ineffective and result in a reduced yield because a ratio of normal cells to defective cells in the semiconductor memory device is likely to be very low. Thus, when detecting any defective unit cell during manufacturing and testing process of the semiconductor memory device, the redundancy circuit replaces the defective unit cell with a redundant memory cell in a repair process in order to secure a higher yield for semiconductor devices having a plurality of unit cells.

When a particular unit cell of the semiconductor memory device is defective, a repair process for substituting the defective unit cell with a spare cell is performed. Namely, an address for accessing the defective unit cell is inputted externally. The repair process is performed in which the address of the defective unit cell is stored to prevent the defective cell from being accessed, and allow another cell to be accessed in place of the defective cell. The fuse is the most commonly used device among those that are used to store the address of the defective unit cell during the repair process. An electronic connection is permanently disabled by applying a laser beam to a target fuse in the semiconductor device, and the address of the defective unit cell can be permanently stored (or programmed) by such a fuse blowing operation.

During a fabricating process of the semiconductor memory device including a plurality of unit cells before the fabrication process of the semiconductor memory device is completed, it is difficult to know which cells among the plurality of unit cells would become defective, i.e., the location or address of a defective cell. Accordingly, a fuse box having a plurality of fuses can be additionally implemented in the semiconductor memory device in order to substitute a normal spare cell for the defective unit cell located in any area of the memory chip.

As the data storage capacity of a semiconductor memory device is increased, the semiconductor memory device is provided with an is increased number of unit cells as well as an increased number of fuses for substituting the defective unit cell with an extra unit cell. However, as the semiconductor memory device is required to have a decreased chip size, the semiconductor memory device needs to have a high integration density. As described above, laser is selectively applied to physically blow a portion of the fuses and therefore. In order not to affect fuses adjacent to the targeted fuse, a sufficient spacing between adjacent fuses should be provided. However, this hinders the obtaining of a high integration density of the semiconductor memory device.

FIGS. 1a and 1b are respectively a circuit diagram and a plan view illustrating a fuse arrangement (or fuse block) in a semiconductor device according to the related art.

Referring to FIG. 1a, a first fuse block 100 and a second fuse block 150 respectively include a plurality of fuses F1 through F4 coupled between a power supply voltage VDD and a ground voltage VSS, switching elements PT and NT for controlling a coupling between the power supply voltage VDD and the ground voltage VSS, and control units N1 through N4 that are controlled by fuse control signals, <B>, <C>, <D>, <E> for the first fuse block 100 and <2>, <3>, <4>, <5> for the second fuse block 150, to allow current to flow depending on conditions of the fuses F1 through F4. Here, if the fuse blocks 100 and 150 are employed in the redundancy circuit, the fuse blocks 100 and 150 are used to store an address of a unit cell of different banks.

An operation of identifying the condition of the fuses F1 to F4 of the first and the second fuse blocks 100 and 150 will be briefly discussed with reference to the circuit diagram of FIG. 1a. In order to determine if a first fuse F1 of the first fuse block 100 blows, a first fuse control signal <B> corresponding to the first fuse F1 is activated such that current flows through a first control unit N1, wherein other fuse control signals <C>, <D> and <E> are inactivated (or not applied) such that current only flows along a path that passes through the first fuse F1. Next, the switching elements PT and NT are activated to connect the fuse with the power supply voltage VDD and the ground voltage VSS. If the first fuse F1 is blown, current does not flow through the first fuse block 100. Otherwise, current flows through the first fuse block 100. In this manner, it is determined whether the first fuse F1 is blown or not.

The four fuses F1 to F4 in the fuse blocks 100 and 150 form, two by two, a Y-shaped fuse pattern. Specifically, the first fuse block 100 includes a first fuse pair 110 and a second fuse pair 120, each of which includes two adjacent fuses. The second block 150 includes a third fuse pair 160 and a fourth fuse pair 170, each of which includes two adjacent fuses.

Referring to FIG. 1b, the first through fourth fuse pairs 110, 120, 160 and 170 shown in FIG. 1a are not arranged in parallel but are arranged to form a Y pattern or an upside down Y pattern, wherein the Y pattern and the upside down Y pattern are arranged alternating with one another. Such structure and arrangement may reduce the size of an area to be occupied by the fuse box. However, in the semiconductor is device having an increased integration density, it becomes difficult to form a diagonal line pattern of the Y-shaped pattern due to limitation of patterning techniques.

FIG. 2 is a picture demonstrating a problem of the fuse of FIGS. 1a and 1b.

As shown in FIG. 2, a plurality of the fuses are arranged in a Y shaped pattern or an upside down Y shaped pattern and a portion of the diagonal lines of respective Y or upside down Y shaped patterns are damaged.

Specifically, when patterning the Y shaped fuse after an electrically conducting material is mounted, in case of a straight line pattern, it is easy to secure a manufacturing margin so that a required width of a designed pattern can be implemented. However, in case of a diagonal line pattern, if an exposure time is increased in order to secure the width of the pattern, the diagonal line pattern may be connected with adjacent patterns. Therefore, in order to avoid this, the Y shaped pattern is configured to have a thin width in contrast to the straight line pattern during a lithography process using a mask. When the fuse has a thin width, the resistance of the fuse is increased so that current flowing through the fuse may not be detected due to high resistance thereof, which causes an erroneous operation of the semiconductor device.

In addition, as the manufacture margin is reduced due to a high integration density, the diagonal line pattern having a thin width can be cut off. If the diagonal line pattern is cut off, the fuse becomes inoperable regardless of whether the straight line pattern blows. Particularly, when the fuse used in the redundancy circuit of the semiconductor memory device is cut off, the semiconductor memory device cannot remember the address of the defective unit cell so that the defective unit cell cannot be repaired. In this case, the yield of the semiconductor memory device is greatly decreased.

BRIEF SUMMARY OF THE INVENTION

Embodiments of an embodiment of the present invention are directed to a fuse applicable to a highly integrated semiconductor device, which implements a fuse having a bar type pattern that forms a straight line instead of a pattern that is difficult to secure a manufacturing margin (for example, a crooked shape pattern or a diagonal line pattern), thereby preventing a defect from occurring during a manufacturing process of the semiconductor device so that a fuse having an increased reliability is provided.

According to an embodiment of the invention, a fuse block including a plurality of fuses comprises a plurality of first connection parts, each including a blowing area, a plurality of second connection parts, wherein the plurality of the second connection parts and the plurality of the corresponding first connection parts respectively form part of the fuse, and a common connection unit configured to electrically connect the plurality of the first connection parts and the plurality of the second connection parts.

In an embodiment of the invention, each first connection part and each second connection part are connected to one of a plurality of different terminals and one of a plurality of different voltage levels. The number of the second connection parts is 1 and more and N/2 and less when the number of the plurality of the first connection parts is N (N is a natural number). Also, the common connection unit is a shape of bar.

According to an embodiment of the invention, a semiconductor device includes a fuse block having a plurality of fuses that are electrically connected to one another; a control unit configured to control current flow through the plurality of the fuses included in the fuse block; and a determination unit configured to provide an output of the fuse block in response to a bank address.

Herein, the fuse block comprises a plurality of first connection parts, each of which including a blowing area, the plurality of the first connection parts being connected to a first voltage, a plurality of second connection parts connected to a second voltage; and a bar-type common connection unit configured to electrically couple the plurality of the first connection parts and the plurality of the second connection parts.

In one embodiment, a semiconductor device has first and second fuse blocks. Each fuse block includes a plurality of fuses sharing a common node, a plurality of control units, and a determination unit. Each control unit is coupled to a corresponding fuse in the plurality of the fuses and is configured to control current flow through the corresponding fuse according to a control signal, so that the plurality of the control units can output a fuse signal. The determination unit has a first input node configured to receive the fuse signal from the control units and a second input node configured to receive a bank address. The determination unit is configured to provide an output signal based on the fuse signal and the is bank address received. The first and second fuse blocks are coupled to each other at the common node.

DESCRIPTION OF EMBODIMENTS

The present invention relates to a highly integrated semiconductor device having an increased reliability by increasing a manufacturing margin of a fuse block included in the semiconductor device, wherein the fuse block is used to selectively connect a plurality of terminals to one another and connect a plurality of voltages having different voltage levels to one another. In the following disclosure, for illustrative purposes, the fuse block is described to be included in a redundancy circuit for storing an address of a defective unit cell of the semiconductor memory device. Hereinafter, examplarly embodiments of the present invention are described in detail with reference to accompanying drawings.

Figure 3A:
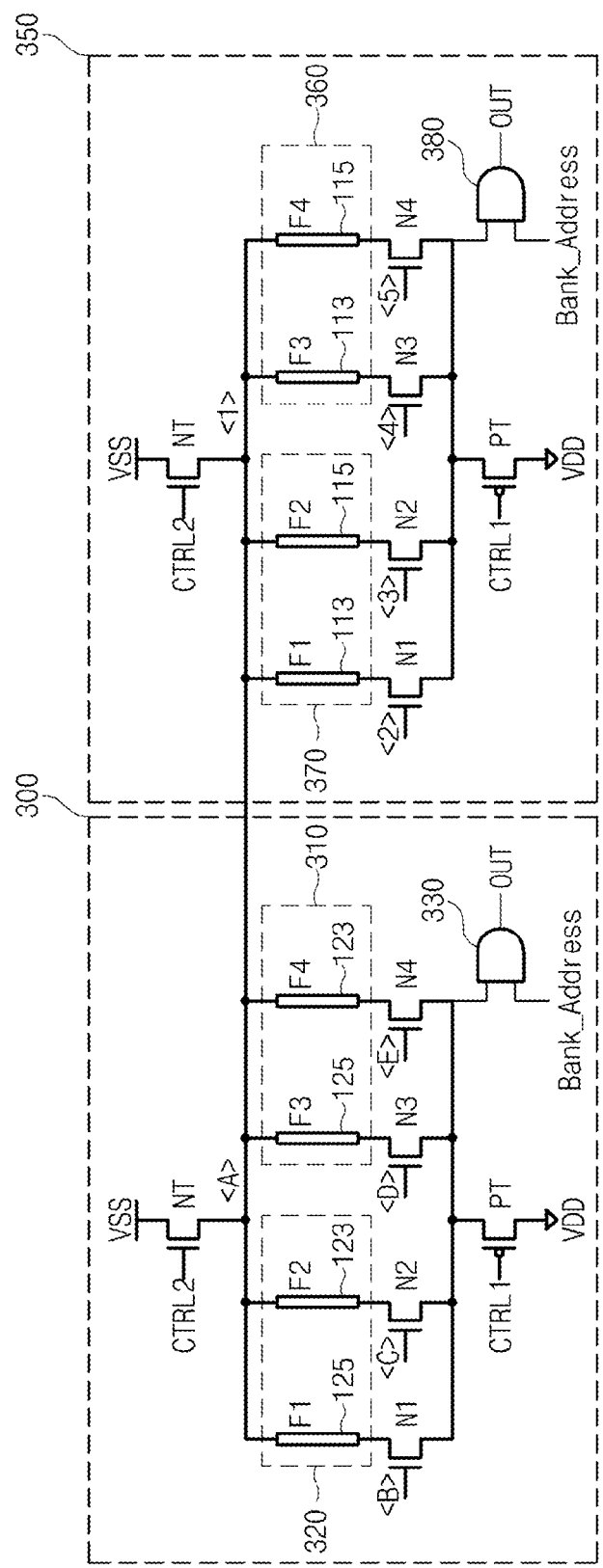
FIGS. 3a and 3b are respectively a circuit diagram and a plan view of a semiconductor device according to an embodiment of the present invention.
Figure 3B:
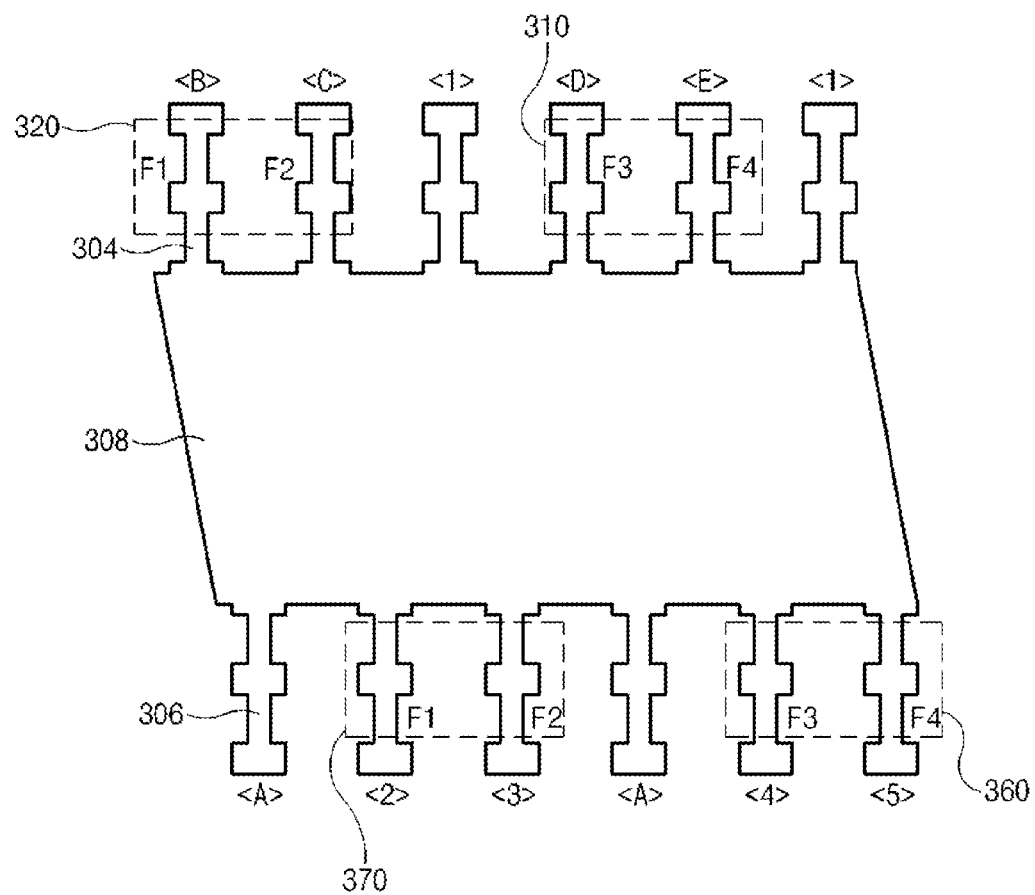

FIGS. 3a and 3b are respectively a circuit diagram and a plan view of a semiconductor device according to an embodiment of the present invention.

Referring to FIG. 3a, a first fuse block 300 and a second fuse block 350 respectively include a plurality of fuses F1 through F4 coupled between a power supply voltage VDD and a ground voltage VSS, switching elements PT and NT for controlling a coupling between the power supply voltage VDD and the ground voltage VSS based on a first control signal CTRL1 and a second control signal CTRL2. Control units N1 through N4 are controlled by fuse control signals (<B>, <C>, <D>, <E> for the first fuse block 300 and <2>, <3>, <4>, <5> for the second fuse block 350) to allow current to flow depending on conditions of the fuses F1 through F4. Determination units 330 and 380 are configured to output an output OUT of the fuses F1 through F4 in response to a bank address Bank_Address. Each of the first and the second fuse blocks 300 and 350 includes two pairs of the fuses, 310 and 320 for the first fuse block 300 and 360 and 370 for the second fuse block 350. Here, for illustrative purposes, the first and the second fuse blocks 300 and 350 are described as those that are used in the redundancy circuit to store an address of a unit cell of different banks.

Figure 1A:
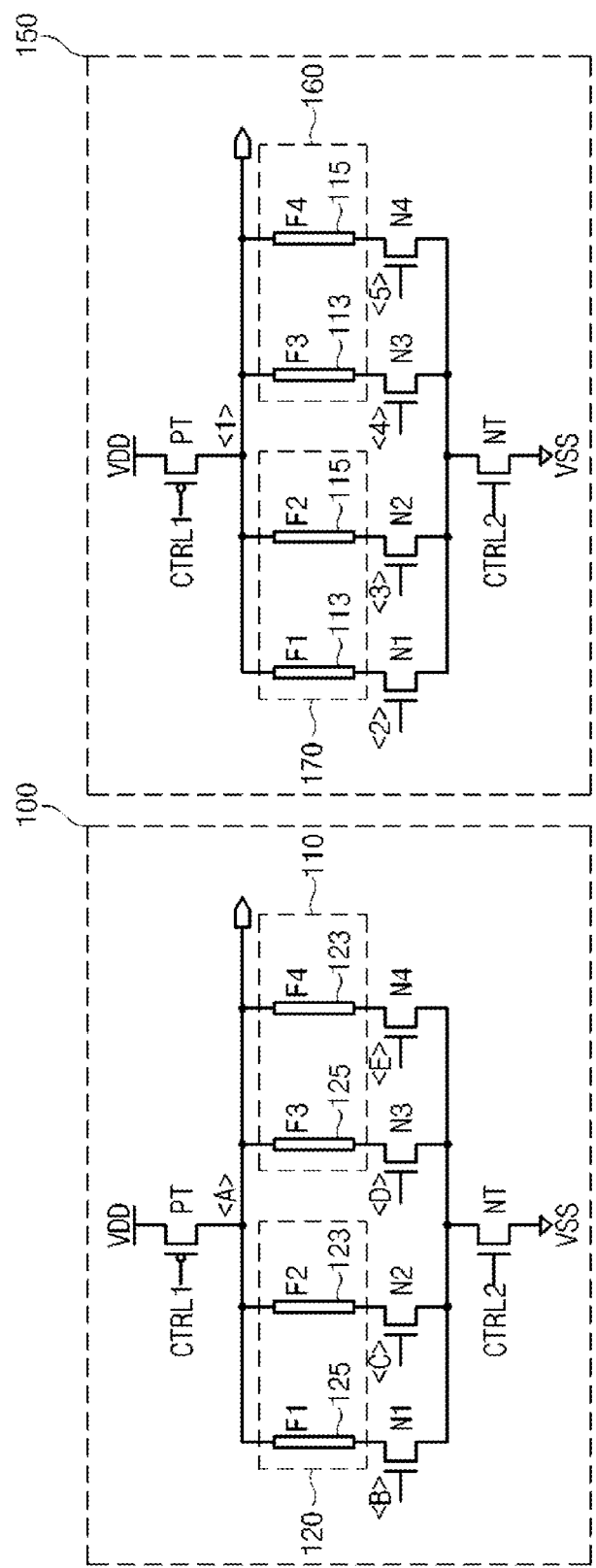
FIGS. 1a and 1b are respectively a circuit diagram and a plan view illustrating a fuse in a semiconductor device according to the related art.
Figure 1B:
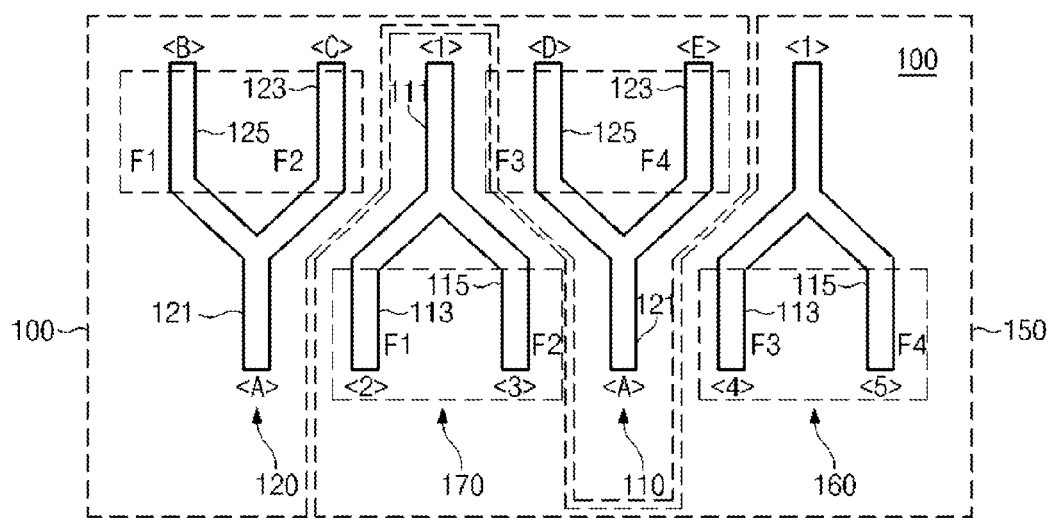
Figure 2:
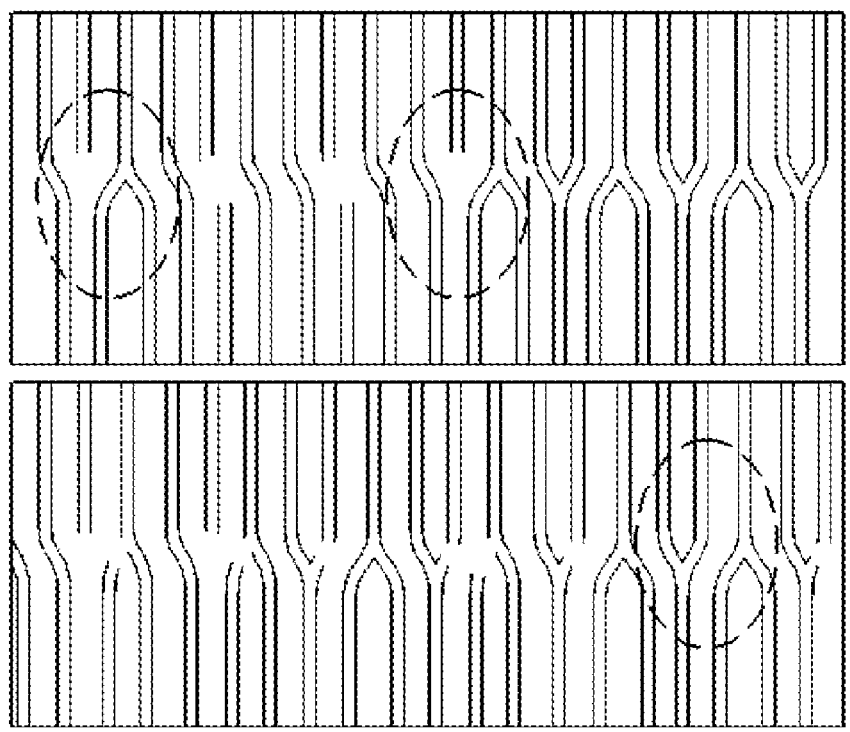
FIG. 2 is a picture demonstrating a problem of the fuse of FIGS. 1a and 1b.

The determination units 330 and 380 are used to output the outputs OUT of the fuses F1 through F4 in response to the bank address Bank_Address. Similar to the semiconductor device according to the related art shown in FIG. 1a, the first and the second fuse blocks 300 and 350 respectively include two pairs of fuses, 310 and 320 for the first fuse is block 300 and 360 and 370 for the second fuse block 350. Here, for illustrative purposes, the first and the second fuse blocks 300 and 350 are described as those that are used in the redundancy circuit to store an address of a unit cell of different banks.

With reference to the circuit diagram of FIG. 3a, it is described an operation of identifying the condition of the fuses F1 through F4 of the first and the second fuse blocks 300 and 350. In order to determine if a first fuse F1 of the first fuse block 300 is blown, a first control signal <B> corresponding to the first fuse F1 is activated such that current flows through a first control unit N1, wherein other fuse control signals <C>, <D> and <E> are inactivated such that current only flows along a path that passes through the first fuse F1. Next, the switching elements PT and NT are activated to connect the fuse with the power supply voltage VDD and the ground voltage VSS. If the first fuse F1 is blown, current does not flow through the first fuse block 300. Otherwise, current flows through the first fuse block 300. In this manner, it is determined whether the first fuse F1 is blown. The determination units 330 and 380 performs a logic operation (e.g., AND logic operation) on an output value of current that is provided depending on whether the first fuse F1 is blown and a logic value of the bank address Bank_Address. Then, the determination units 330 and 380 output the result of the logic operation.

Referring to FIG. 3b, the plurality of the fuses F1 through F4 included in the two fuse blocks 300, 350 shown in FIG. 3a are not arranged to be parallel to one another but are configured to connect to each other at a central part to form a fuse block. Specifically, the fuse is block includes a first connection part 304 connected with a first power source that provides the power supply voltage VDD, wherein the first connection part 304 includes a blowing area, that is, the fuses F1 through F4, a second connection part 306 that is connected between the ground voltage VSS and a second voltage, and a bar type common connection part 308 for connecting a plurality of the first connecting parts 304 and a plurality of the second connecting parts 306.

Compared to a configuration of a conventional semiconductor device where a Y pattern is arranged alternatingly, the two fuse blocks 300, 350 according to one example embodiment of the present invention are connected to each other through the common connection part 308 so that eight fuses included in the two fuse blocks 300 and 350 are electronically connected to one another. By using the common connection part 308, the fuse block manufactured according to the present invention overcomes certain problems associated with a conventional fuse block having the Y pattern fuse, e.g., a width that is so thin in a diagonal line of the Y pattern such that the diagonal line fuse becomes weaker or even cut off. Therefore, when forming the fuse block, an increase in resistance or defects caused due to manufacture error can be prevented in advance so that a fixed to attempt (FTA) of the semiconductor device by using the fuses F1 through F4 can be increased.

In FIG. 3b, it is described that the first and the second fuse blocks 300 and 350 shown in FIG. 3a form a bar-type fuse block by connecting central parts of the first and the second fuse blocks 300 and 350. However, it should be noted that the structure or arrangement of the is fuse block 300 or 350 can be modified in different embodiments. For example, when a plurality of the first connection parts 304 and a plurality of the second connection parts 306 are spaced apart from one another by a minimum required distance in consideration of a situation where fuse blowing occurs, the first connection parts 304 and the second connection parts 306 can be connected to respective sides of the common connection part 308 to be arranged in a straight row. Also, it is possible to reduce the number of the second connection part 306 that does not have a blowing area. In FIG. 3b, there are eight first connection parts 304 and four second connection parts 306, i.e., the first connection parts 304 and the second connection parts 306 form a ratio of 2:1 therebetween. However, the semiconductor device of FIG. 3b is illustrated as an example, and the invention is not limited to that configuration. For example, only two connection parts 306 can be used in an alternative embodiment. In other words, if the number of the first connection part 304 that has a blowing area included in one fuse block 300 is N (N is a natural number), the number of the second connection part 306 that does not have the blowing area may be a 1 and more and N/2 and less.

Figure 4:
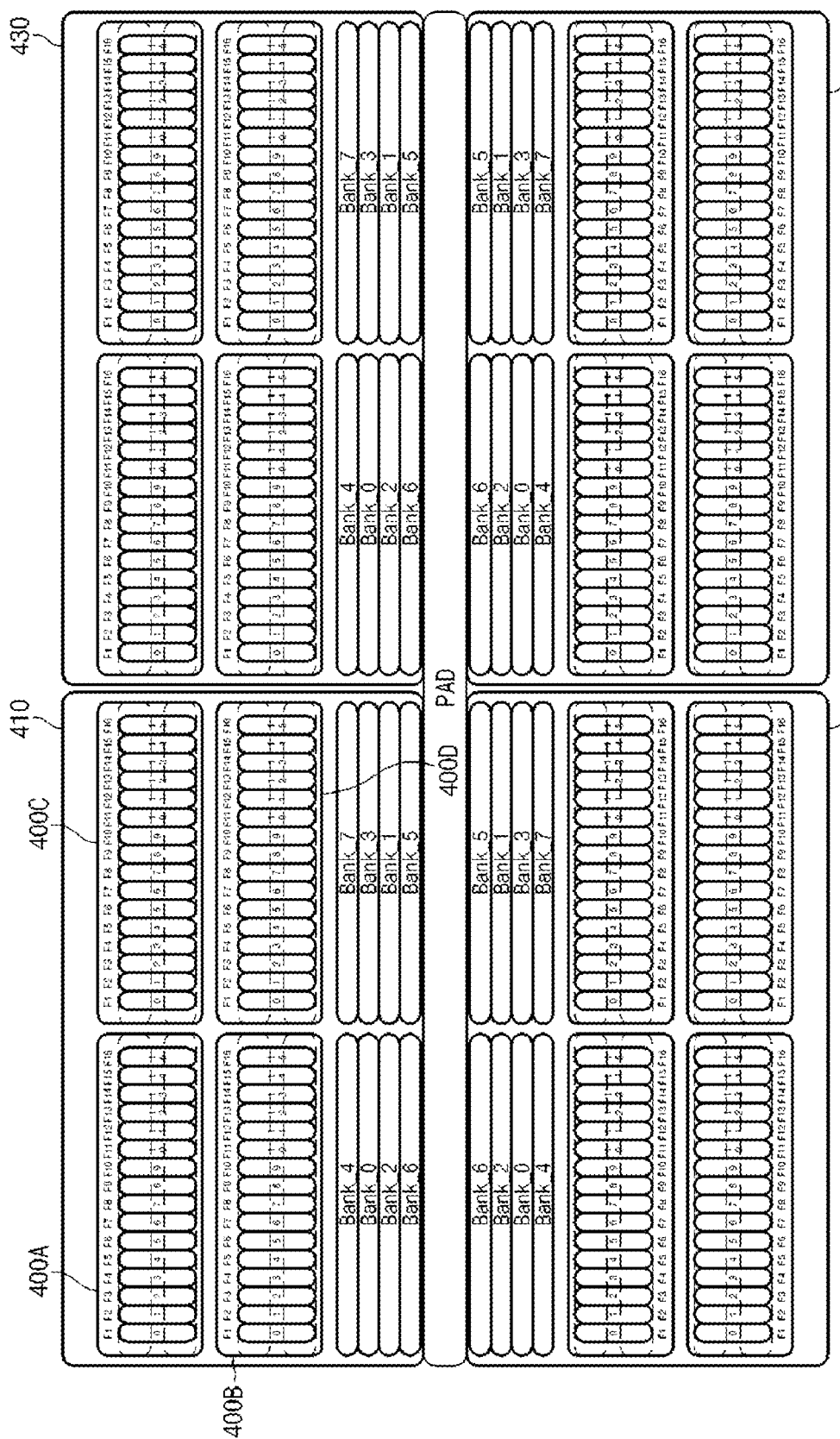
FIG. 4 is a conceptional view of a semiconductor device according to an embodiment of the present invention.

FIG. 4 is a conceptual view of a semiconductor device using the fuse shown in FIGS. 3a and 3b according to an embodiment of the present invention.

As shown in FIG. 4, the semiconductor device includes a plurality of bank blocks 410, 420, 430 and 440, wherein each of the bank blocks 410, 420, 430 and 440 includes eight banks and four fuse circuits. For example, the bank block 410 includes eight banks Bank_0 through Bank_7 and four fuse circuits 400A, 400B, 400C and 400D. Each of the fuse circuits, for example, the fuse circuit 400A is designed to remember an address of a defective unit cell that exists within two neighboring banks, for example, Bank_4 and Bank_0 among the eight banks Bank_0 through Bank_7. The fuse circuit, e.g., 400A, includes sixteen fuse blocks F0 through F15, each of which has a structure substantially the same with a structure of the fuse block 300 shown in FIGS. 3a and 3b. Namely, when the address of the defective unit cell has 16 bits, the fuse block shown in FIG. 3b remembers one bit of the address of the defective unit cell that exists within two neighboring banks and determines which bank has the defective unit cell by using a separate determination unit. Here, the 16 bits of the unit cell may include a 3-bit bank address, a 3-bit cell block address, and a 7-bit column address. The bit number of the address and the number of the fuse blocks to be included in the semiconductor device may vary according to the specifications of the semiconductor device.

As described above, when forming a fuse for use in a highly integrated semiconductor device according to the present invention, a manufacturing margin can be secured by modifying the shape of the pattern of the fuse block while utilizing a simple circuit such as a determination unit so that the semiconductor device performs a normal operation. Therefore, an additional process is not required. In this manner, the present invention can prevent a defect from occurring during a manufacturing process of the semiconductor device, thereby increasing is the reliability of the semiconductor device. Also, since the fuse box formed according to the present invention has a bar type pattern, which is easy to manufacture, the fuse box has a relatively low cost for both design and manufacturing.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A fuse block including a plurality of fuses, the fuse block comprising:
   a plurality of first connection parts coupled to a first voltage, each including a blowing area;
   a plurality of second connection parts coupled to a second voltage; and
   a bar-type common connection part comprising a first side and a second side and configured to electrically connect the plurality of the first connection parts and the plurality of the second connection parts,
   wherein the plurality of first connection parts and the plurality of second connection parts extend from the first and second sides of the bar-type common connection part.

2. The fuse block of claim 1, wherein each first connection part is connected to one of a plurality of terminals, and each terminal is configured to receive a separate voltage.

3. The fuse block of claim 2, wherein the number of the second connection parts is at least 1 and no more than N/2, where N represents the number of the first connection parts.

4. The fuse block of claim 1, wherein the first voltage is a power supply voltage and the second voltage is a ground voltage.

5. A semiconductor device having a fuse block, the fuse block comprising:
   a plurality of fuses that are electrically coupled to each other;
   a plurality of control units, each control unit coupled to a corresponding fuse from among the plurality of fuses and configured to control current flow through the corresponding fuse according to a control signal;
   a determination unit having a first input node configured to receive a fuse signal from the control units and a second input node configured to receive a bank address, the determination unit configured to provide an output signal based on the fuse signal and the bank address received;
   a plurality of first connection parts, each of which includes a blowing area, the plurality of the first connection parts being coupled to a first voltage;
   a plurality of second connection parts coupled to a second voltage; and
   a bar-type common connection unit configured to electrically couple the plurality of the first connection parts and the plurality of the second connection parts.

6. The semiconductor device of claim 5, wherein the number of the second connection parts is at least 1 and no more than and N/2, and wherein N represents the number of the first connection parts.

7. The semiconductor device of claim 5, wherein the fuse block further comprises:
   a first supply unit configured to supply the first voltage to the fuse block in response to a first signal; and
   a second supply unit configured to supply the second voltage to the fuse block in response to a second signal.

8. The semiconductor device of claim 7, wherein when the first voltage is a power supply voltage and the second voltage is a ground voltage.

9. The semiconductor device of claim 5, wherein the fuse block is configured to store one bit of an address of a unit cell of two adjacent banks.

10. The semiconductor device of claim 5, wherein the determination unit comprises a logic gate.

* * * * *